(12) United States Patent
Kuan et al.

(10) Patent No.: US 9,484,918 B1
(45) Date of Patent: Nov. 1, 2016

(54) DUAL EDGE PULSE DE-MULTIPLEXER WITH EQUALIZED PATH DELAY

(71) Applicant: HRL LABORATORIES, LLC, Malibu, CA (US)

(72) Inventors: Yen-Cheng Kuan, Los Angeles, CA (US); Ining Ku, Irvine, CA (US); Zhiwei A. Xu, Davis, CA (US); Susan L. Morton, Pittsford, NY (US); Donald A. Hitko, Grover Beach, CA (US); Peter Petre, Oak Park, CA (US); Jose Cruz-Albrecht, Oak Park, CA (US); Alan E. Reamon, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/834,837

(22) Filed: Aug. 25, 2015

(51) Int. Cl.
H03K 19/003 (2006.01)
H03K 19/00 (2006.01)

(52) U.S. Cl.
CPC .... H03K 19/00369 (2013.01); H03K 19/0016 (2013.01)

(58) Field of Classification Search
CPC ............... H03K 19/00369; H03K 19/0016
USPC ........................................................ 326/93
See application file for complete search history.

(56) References Cited

U.S. PATENT DOCUMENTS

| | | | |
|---|---|---|---|
| 4,383,248 A | 5/1983 | Smith | |
| 4,939,515 A | 7/1990 | Adelson | |
| 5,185,715 A | 2/1993 | Zikan et al. | |
| 5,345,398 A | 9/1994 | Lippmann et al. | |
| 5,396,244 A | 3/1995 | Engel | |
| 5,479,170 A | 12/1995 | Cauwenberghs et al. | |
| 5,490,062 A | 2/1996 | Leach et al. | |
| 5,566,099 A | 10/1996 | Shimada | |
| 5,815,102 A | 9/1998 | Melanson | |
| 5,894,280 A | 4/1999 | Ginetti et al. | |
| 5,910,763 A | 6/1999 | Flanagan | |
| 6,087,968 A | 7/2000 | Roza | |
| 6,111,531 A | 8/2000 | Farag | |
| 6,172,536 B1 | 1/2001 | Yoshihara | |
| 6,452,524 B1 | 9/2002 | Fraleigh et al. | |
| 6,473,019 B1 | 10/2002 | Ruha et al. | |
| 6,492,798 B2 * | 12/2002 | Sunter ................ | G01R 31/3167 324/76.15 |
| 6,940,438 B2 | 9/2005 | Koe et al. | |
| 6,975,682 B2 | 12/2005 | Cosand | |
| 7,038,608 B1 | 5/2006 | Gilbert | |
| 7,148,829 B2 | 12/2006 | Inukai | |

(Continued)

OTHER PUBLICATIONS

U.S. Appl. No. 14/144,903, filed Dec. 31, 2013, Cruz-Albrecht et al.

(Continued)

*Primary Examiner* — Dylan White
(74) *Attorney, Agent, or Firm* — Ladas & Parry

(57) ABSTRACT

A pulse domain 1 to 2N demultiplexer has a (i) pair of N stage counters each of which is responsive to an incoming pulse train in the pulse domain, one of the counters being responsive to leading edges of the pulses in the incoming pulse train and the other one of the counters being responsive to trailing edges of the pulses in the incoming pulse train and (ii) a control logic responsive to the states through which the pair of counters count, the control logic including 2N gate arrangements, each of the 2N gate arrangements generating a output signal of the pulse domain 1 to 2N demultiplexer.

15 Claims, 14 Drawing Sheets

(56) References Cited

U.S. PATENT DOCUMENTS

| | | | |
|---|---|---|---|
| 7,180,432 B2 | 2/2007 | Oliaei | |
| 7,184,359 B1 * | 2/2007 | Bridgewater | G11C 8/16 365/154 |
| 7,253,761 B1 | 8/2007 | Hoyos et al. | |
| 7,277,797 B1 | 10/2007 | Kunitsyn et al. | |
| 7,324,035 B2 | 1/2008 | Harris et al. | |
| 7,403,144 B1 | 7/2008 | Cruz-Albrecht et al. | |
| 7,405,686 B2 | 7/2008 | Laroia et al. | |
| 7,515,084 B1 | 4/2009 | Cruz-Albrecht et al. | |
| 7,573,956 B2 | 8/2009 | Lazar et al. | |
| 7,583,213 B2 | 9/2009 | Wang et al. | |
| 7,592,939 B1 | 9/2009 | Cruz-Albrecht et al. | |
| 7,724,168 B1 | 5/2010 | Cruz-Albrecht et al. | |
| 7,750,835 B1 | 7/2010 | Cruz-Albrecht et al. | |
| 7,822,698 B1 | 10/2010 | Cruz-Albrecht et al. | |
| 7,965,216 B1 | 6/2011 | Petre et al. | |
| 7,996,452 B1 | 8/2011 | Cruz-Albrecht et al. | |
| 8,169,212 B2 | 5/2012 | Rivoir | |
| 8,566,265 B1 | 10/2013 | Cruz-Albrecht et al. | |
| 8,595,157 B2 | 11/2013 | Cruz-Albrecht et al. | |
| 9,082,075 B1 | 7/2015 | Cruz-Albrecht et al. | |
| 2005/0190865 A1 | 9/2005 | Lazar et al. | |
| 2006/0087467 A1 | 4/2006 | Itskovich | |
| 2006/0092059 A1 | 5/2006 | Guimaraes | |
| 2007/0069928 A1 | 3/2007 | Gehring et al. | |
| 2009/0303070 A1 | 12/2009 | Zhang et al. | |
| 2010/0225824 A1 | 9/2010 | Lazar et al. | |
| 2010/0321064 A1 | 12/2010 | Mathe | |
| 2011/0028141 A1 | 2/2011 | Yang et al. | |
| 2012/0213531 A1 | 8/2012 | Nazarathy et al. | |

OTHER PUBLICATIONS

U.S. Appl. No. 60/984,354, filed Oct. 31, 2007, Cruz-Albrecht et al.

U.S. Appl. No. 60/984,357, filed Oct. 31, 2007, Petre et al.

Cruz, J.M., et al., "A 16×16 Cellular Nueral Network Universal Chip: The First Complete Single-Chip Dynamic computer Array with Distributed Memory and with Gray Scale Input-Output," *Analog Integrated Circuits and Signal Processing*, 15, pp. 227-237 (1998).

Dighe, A.M., et al., "An Asynchronous Serial Flash Converter," *9th Int. Conf. on Electronics, Circuits and Systems, IEEE*, pp. 13-15, (2002).

Donoho, D. "Compressed Sensing", *IEEE Transactions on Information Theory*, vol. 52, No. 4, pp. 1289-1306, (Apr. 2006).

Hasler et al., "VLSI Neural Systems and Circuits" *IEEE*, pp. 31-37, (1990).

Indiveri, Giacomo, "A Low-Power Adaptive Integrated-and-Fire Neuron Circuit," *IEEE International Symposium on Circuits and Systems*, vol. IV, pp. 820-823, (2003).

Iwamoto, M. et al., "Bandpass Delta-Sigma Class-S Amplifier," *Electronic Letters*, vol. 36, No. 12, pp. 1010-1012, (Jun. 8, 2000).

Izhikevich, Eugene M., "Which Model to Use for Cortical Spiking Neurons?," *IEEE Transactions on Neural Networks*, vol. 15, No. 5, pp. 1063-1070, (Sep. 2004).

Keane, John F. and Atlas, Les E., "Impulses and Stochastic Arithmetic for Signal Processing," *Proc. 2001 IEEE International Conference on Acoustics, Speech, and Signal Processing*, pp. 1257-1260, (2001).

Lazar, Aurel A. and Toth, Laszlo T., "Perfect Recovery and Sensitivity Analysis of Time Encoded Bandlimited Signals," *IEEE Transactions on Circuits and Systems I: Regular Papers*, vol. 51, No. 10, pp. 2060-2073, (Oct. 2004).

Ouzounov, S. et al., "Design of High-Performance Asynchronous Sigma Delta Modulators with a Binary Quantizer with Hysteresis," *IEEE 2004 Custom Integrated Circuits Conference*, pp. 181-184, (2004).

Perrinet, Laurent, "Emergence of filters from natural scenes in a sparse spike coding scheme," pp. 821-826, (2004).

Raisanen-Ruotsalainen, Elvi, Rahkonen, Timo, and Kostamovaara, Juha, "An Integrated Time-to-Digital Converter with 30-ps. Single-Shot Precision," *IEEE Journal of Solid-State Circuits*, vol. 35, No. 10, pp. 1507-1510, (Oct. 2000).

Roza, Engel, "Analog-to-Digital Conversion via Duty-Cycle Modulation," *IEEE Transactions on Circuits and Systems-II: Analog and Digital Signal Processing*, vol. 44, No. 11, pp. 907-914, (Nov. 1997).

Walden, Robert H., "Analog-to-Digital Converter Survey and Analysis," *IEEE Journal on Selected Areas in Communications*, vol. 17, No. 4, pp. 539-550, (Apr. 1999).

Wang et al., "Review of pulse-coupled neural networks," *Image and Vision Computing 28*, pp. 5-13, (Jun. 5, 2009).

Xia, Youshen and Wang, Jun, "A Recurrent Neural Network for Solving Nonlinear Convex Programs Subject to Linear Constraints," *IEEE Transactions on Neural Networks*, vol. 16, No. 2, (Mar. 2005).

"Relaxation Oscillator." Wikipedia: The Free Encyclopedia. Wikimedia Foundation, Inc. Jun. 18, 2010. Web. Mar. 11, 2015. <http://en.wikipedia.org/wiki/Relaxation_oscillator>.

"Van der Pol Oscillator." Wikipedia: The Free Encyclopedia. Wikimedia Foundation, Inc. Jun. 18, 2010. Web. Mar. 11, 2015. <http://en.wikipedia.org/wikiNan_der_Pol_osciliator>.

International Search Report and Written Opinion for PCT/US2012/040043, mailed on Jan. 14, 2013.

International Preliminary Report on Patentability (IPRP) for PCT/US2012/040043, dated Dec. 2, 2013.

From U.S. Appl. No. 11/595,107 (Now U.S. Pat. No. 7,996,452), Non-Final Rejection mailed on Jun. 24, 2010.

From U.S. Appl. No. 11/595,107 (Now U.S. Pat. No. 7,996,452), Final Rejection mailed on Nov. 29, 2010.

From U.S. Appl. No. 11/595,107 (Now U.S. Pat. No. 7,996,452), Notice of Allowance mailed on Apr. 4, 2011.

From U.S. Appl. No. 11/726,484 (Now U.S. Pat. No. 7,515,084), Restriction/Election mailed on May 22, 2008.

From U.S. Appl. No. 11/726,484 (Now U.S. Pat. No. 7,515,084), Ex Parte Quayle Action mailed on Sep. 10, 2008.

From U.S. Appl. No. 11/726,484 (Now U.S. Pat. No. 7,515,084), Notice of Allowance mailed on Dec. 2, 2008.

From U.S. Appl. No. 11/726,860 (Now U.S. Pat. No. 7,822,698), Restriction/Election mailed on Mar. 8, 2010.

From U.S. Appl. No. 11/726,860 (Now U.S. Pat. No. 7,822,698), Notice of Allowance mailed on Jun. 11, 2010.

From U.S. Appl. No. 12/118,475 (Now U.S. Pat. No. 7,592,939), Notice of Allowance mailed on May 22, 2009.

From U.S. Appl. No. 12/262,691 (Now U.S. Pat. No. 7,965,216), Non-Final Rejection mailed on Apr. 7, 2010.

From U.S. Appl. No. 12/262,691 (Now U.S. Pat. No. 7,965,216), Non-Final Rejection mailed on Aug. 23, 2010.

From U.S. Appl. No. 12/262,691 (Now U.S. Pat. No. 7,965,216), Notice of Allowance mailed on Feb. 17, 2011.

From U.S. Appl. No. 12/262,782 (Now U.S. Pat. No. 7,724, 168), Notice of Allowance mailed on Jan. 11, 2010.

From U.S. Appl. No. 12/266,299 (Now U.S. Pat. No. 7,750,835), Notice of Allowance mailed on Mar. 22, 2010.

From U.S. Appl. No. 12/266,299 (Now U.S. Pat. No. 7,750,835), Notice of Allowance mailed on Jun. 22, 2010.

From U.S. Appl. No. 13/044,922 (Now U.S. Pat. No. 8,566,265), Restriction/Election mailed on Apr. 26, 2013.

From U.S. Appl. No. 13/044,922 (Now U.S. Pat. No. 8,566,265), Notice of Allowance mailed on Jun. 20, 2013.

From U.S. Appl. No. 13/151,763 (Now U.S. Pat. No. 8,595, 157), Notice of Allowance mailed on Jul. 18, 2013.

From U.S. Appl. No. 14/032,082 (Now U.S. Pat. No. 9,082,075), Non-Final Rejection mailed on Sep. 10, 2014.

From U.S. Appl. No. 14/032,082 (Now U.S. Pat. No. 9,082,075), Notice of Allowance mailed on Mar. 9, 2014.

From U.S. Appl. No. 14/144,903 (unpublished, non publication requested), Non-Final Rejection mailed on Dec. 12, 2014.

From U.S. Appl. No. 14/144,903 (unpublished, non publication requested), Notice of Allowance mailed on Jun. 1, 2015.

* cited by examiner

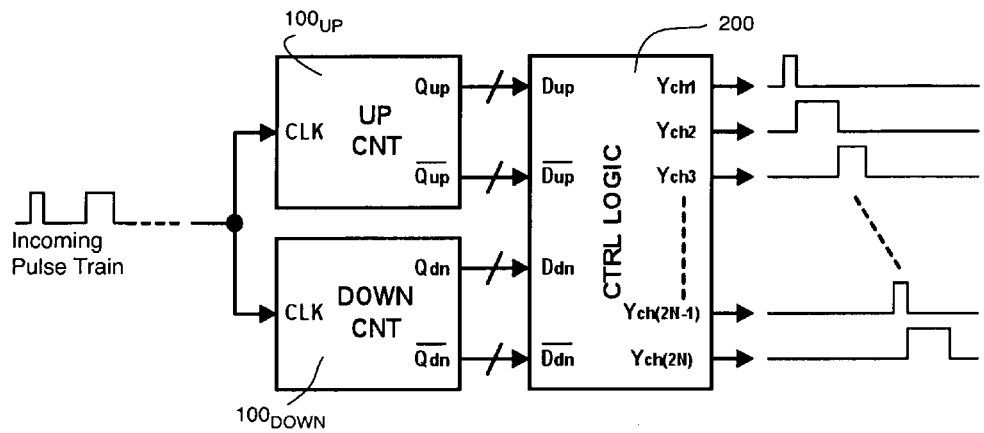
Fig. 1a
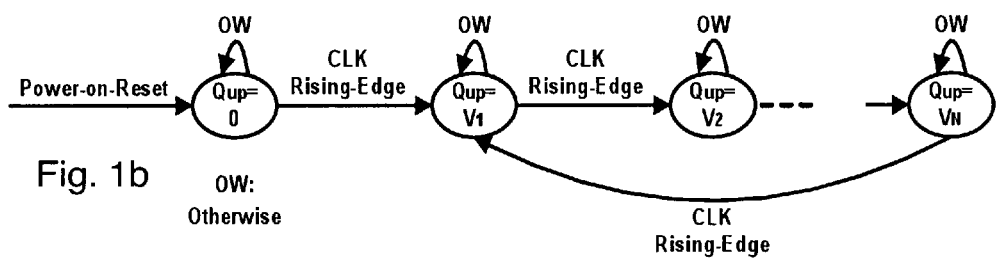
Fig. 1b   OW: Otherwise
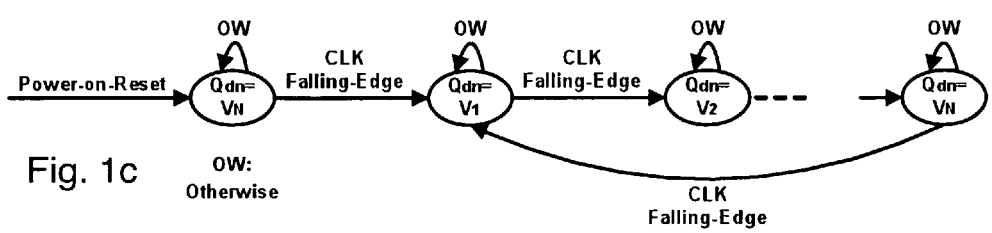
Fig. 1c   OW: Otherwise

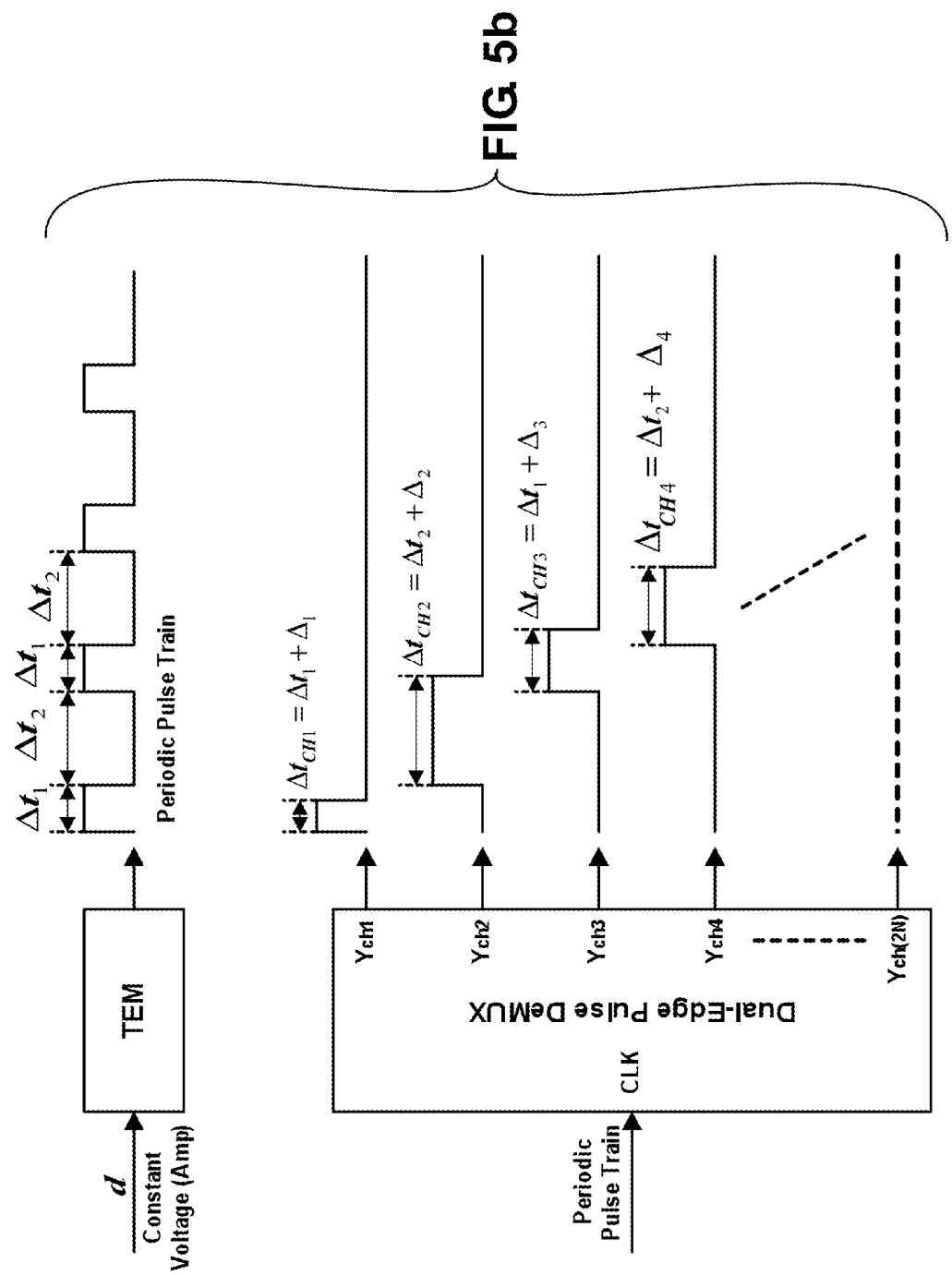

Odd Channels

Nch:# of Channels
dk: constant value
M: #of constant values $$(\Delta t_1)_{d_k} \cong \frac{1}{(N_{CH}/2)} \sum_{k=1}^{N_{CH}/2}(\Delta t_{CH_{2k-1}})_{d_k}$$

$$(\Delta_1)_{d_k} = (\Delta t_{CH_1})_{d_k} - (\Delta t_1)_{d_k}$$

$$(\Delta_3)_{d_k} = (\Delta t_{CH_3})_{d_k} - (\Delta t_1)_{d_k}$$

$$(\Delta_5)_{d_k} = (\Delta t_{CH_5})_{d_k} - (\Delta t_1)_{d_k}$$

$$(\Delta_7)_{d_k} = (\Delta t_{CH_7})_{d_k} - (\Delta t_1)_{d_k}$$

$$(\Delta_9)_{d_k} = (\Delta t_{CH_9})_{d_k} - (\Delta t_1)_{d_k}$$

$$\Delta_1 = \frac{1}{M}\sum_{k=1}^{M}(\Delta_1)_{d_k}$$

$$\Delta_3 = \frac{1}{M}\sum_{k=1}^{M}(\Delta_3)_{d_k}$$

$$\Delta_5 = \frac{1}{M}\sum_{k=1}^{M}(\Delta_5)_{d_k}$$

$$\Delta_7 = \frac{1}{M}\sum_{k=1}^{M}(\Delta_7)_{d_k}$$

$$\Delta_9 = \frac{1}{M}\sum_{k=1}^{M}(\Delta_9)_{d_k}$$

$$\Delta t_{CH_1-CAL} = \Delta t_{CH_1} - \Delta_1$$

$$\Delta t_{CH_3-CAL} = \Delta t_{CH_3} - \Delta_3$$

$$\Delta t_{CH_5-CAL} = \Delta t_{CH_5} - \Delta_5$$

$$\Delta t_{CH_7-CAL} = \Delta t_{CH_7} - \Delta_7$$

$$\Delta t_{CH_9-CAL} = \Delta t_{CH_9} - \Delta_9$$

$$(\Delta t_2)_{d_k} \cong \frac{1}{(N_{CH}/2)} \sum_{k=1}^{N_{CH}/2}(\Delta t_{CH_{2k}})_{d_k}$$

$$(\Delta_2)_{d_k} = (\Delta t_{CH_2})_{d_k} - (\Delta t_2)_{d_k}$$

$$(\Delta_4)_{d_k} = (\Delta t_{CH_4})_{d_k} - (\Delta t_2)_{d_k}$$

$$(\Delta_6)_{d_k} = (\Delta t_{CH_6})_{d_k} - (\Delta t_2)_{d_k}$$

$$(\Delta_8)_{d_k} = (\Delta t_{CH_8})_{d_k} - (\Delta t_2)_{d_k}$$

$$(\Delta_{10})_{d_k} = (\Delta t_{CH_{10}})_{d_k} - (\Delta t_2)_{d_k}$$

$$\Delta_2 = \frac{1}{M}\sum_{k=1}^{M}(\Delta_2)_{d_k}$$

$$\Delta_4 = \frac{1}{M}\sum_{k=1}^{M}(\Delta_4)_{d_k}$$

$$\Delta_6 = \frac{1}{M}\sum_{k=1}^{M}(\Delta_6)_{d_k}$$

$$\Delta_8 = \frac{1}{M}\sum_{k=1}^{M}(\Delta_8)_{d_k}$$

$$\Delta_{10} = \frac{1}{M}\sum_{k=1}^{M}(\Delta_{10})_{d_k}$$

$$\Delta t_{CH_2-CAL} = \Delta t_{CH_2} - \Delta_2$$

$$\Delta t_{CH_4-CAL} = \Delta t_{CH_4} - \Delta_4$$

$$\Delta t_{CH_6-CAL} = \Delta t_{CH_6} - \Delta_6$$

$$\Delta t_{CH_8-CAL} = \Delta t_{CH_8} - \Delta_8$$

$$\Delta t_{CH_{10}-CAL} = \Delta t_{CH_{10}} - \Delta_{10}$$

Even Channels

FIG. 6

DUAL EDGE PULSE DE-MULTIPLEXER WITH EQUALIZED PATH DELAY

STATEMENT REGARDING FEDERALLY SPONSORED RESEARCH OR DEVELOPMENT

This invention was made under US Government Contact Number N00014-09-0234 and therefor the US Government may have certain rights in this invention.

CROSS REFERENCE TO RELATED APPLICATIONS

This application is related to the technology disclosed in U.S. Pat. No. 7,515,084, the disclosure of which is hereby incorporated herein by reference.

This application is also related to the technology disclosed in U.S. patent application Ser. No. 14/144,903 filed Dec. 31, 2013 and entitled "Time Encoded Circuits and Methods and a Time Encoder Based Beamformer for Use in Receiving and Transmitting Applications", the disclosure of which is hereby incorporated herein by reference.

TECHNICAL FIELD

This invention relates to a demultiplexer which is responsive to an incoming signal in this pulse domain.

BACKGROUND

The pulse domain (also known as the time domain) is becoming a more and more desirable domain for information encoding and/or transfer. In the analog domain signals are typically represented by both their amplitudes and shapes. In the digital domain, signals represent binary numbers and the intervals between the 1's and 0's of the digital information is typically regulated by a clock in the digital domain. The digital domain has both advantages and disadvantages compared to the analog domain. The digital domain is resistant to amplitude excursions which hamper the analog domain, but a digital domain signal is typically just an approximation of a corresponding analog signal. Information can be lost when an analog signal is digitized.

In contrast, in the pulse domain information (data) is encoded by pulses and it is the interval between successive pulses (and not their amplitudes) which encodes the information (data) being conveyed by a pulse domain signal. So a pulse domain signal has certain advantages over signals in either the digital or analog domains.

The present invention relates to a demultiplexer which demultiplexes a pulse domain signal applied thereto. The disclosed invention in it preferred embodiments utilizes circuits which are used in the prior art in the digital domain and therefore are typically regulated by a clock to transfer data from one gate of a circuit to a following gate. In the disclosed preferred embodiments the data is encoded by the timing of the pulses and therefore the gate operate asynchronously in the disclosed embodiments.

Additionally, with the increasing demands of low supply voltage and small feature size in modern semiconductor process technology used to make various circuits and gates, this inevitably introduces analog circuit design challenges, of which the limited voltage headroom and process-voltage-temperature (PVT) variation are the most noticeable ones. These analog circuit design challenges can impact the asynchronous circuits and gates used in the pulse domain. In the prior art, to combat these challenges, circuit design has trend to be digital-centric which uses a few analog circuits as reasonably possible.

However, researchers have been seeking an alternative domain to the analog domain which uses voltage amplitude (or similarly, the amount of current) to convey signal information. Several time-domain signal processing theories and algorithms, which utilize a voltage-to-time converter to transfer amplitudes (voltages) of input signals into either pulse-widths (in the pulse domain) or widths between spikes (spike domain) of a constant-amplitude asynchronous pulse train at outputs, and recovery the original input signals from the pulse domain or spike domain information, have been investigated and proposed.

When dealing with high speed/large input signals, the voltage-to-time converter has to run at high speed and generate the asynchronous pulse train outputs at high switching rates, which may not be processed directly by the following time-to-digital converter due to the semiconductor process limits noted above. Therefore, a pulse de-multiplexer that can extract all the pulse-widths of a high speed asynchronous pulse train into multiple relatively low speed channels to compensate the circuits speed gap in between the voltage-to-time converter and time-to-digital converter will be extremely useful and practical for the realization of time-domain signal processing theories and algorithms. This invention serves the purpose of such a pulse domain de-multiplexer.

BRIEF DESCRIPTION OF THE INVENTION

In one aspect the present invention relates to a one to 2N pulse domain de-multiplexer. The disclosed pulse domain de-multiplexer includes a pair of asynchronous counters, one of which is responsive to the leading edges of the pulses in an incoming pulse train (to change its count though N possible states) while the other counter is responsive to the trailing edges of the same pulses in the incoming pulse train (to change its count through the same N possible states). The changing of the counts in the two counters is detected by a control logic which has 2N output channels over which the pulses in the incoming pulse train are repeatedly demultiplexed.

The counters and the control logic can introduce variations in the timing of the pulses on the 2N output channels due to the process-temperature-voltage (PVT) variations in modern semiconductor process technology as noted above. Therefore, in another aspect the present invention proposes a hardware architecture and calibration algorithm that can de-multiplex the pulse widths of both rising-to-falling and falling-to-rising edges of a high speed asynchronous pulse train into multiple low speed channels, and equalize the path delays of each channel, which are introduced by the process-temperature-voltage (PVT) variations in modern semiconductor process technology. The proposed hardware architecture and calibration algorithm can work with all the voltage/amplitude-to-time converters, such as Pulse-Wdith-Modulation (PWM) controller, Time-Encode Machine (TEM), Asynchronous Pulse Processor (APP), and etc, to provide multiple asynchronous pulse trains with proper switching rates set by the technology limit to realize the theories and algorithms of time-domain signal processing.

BRIEF DESCRIPTION OF THE DRAWINGS

FIG. 1a is a schematic diagram the overall architecture of the proposed dual edge pulse de-multiplexer with equalized path delay.

FIGS. 1b and 1c show the state diagrams of the UP and DOWN counters depicted in the schematic diagram of FIG. 1a.

FIGS. 2a and 2b depict a preferred embodiment of the UP and DOWN counters depicted in the schematic diagram of FIG. 1a.

FIGS. 5a, 5b and 6 illustrate the proposed calibration algorithm and a circuit for calibration measurements, while

DETAILED DESCRIPTION

FIG. 1a is a schematic of the overall architecture of the proposed dual edge pulse de-multiplexer with equalized path delay. The proposed dual edge pulse de-multiplexer can de-multiplex the pulse widths of both rising-to-falling and falling-to-rising edges of a relatively high speed (for example, 2 GHz or greater) incoming asynchronous pulse train into multiple relatively low speed channels, and equalize the path delays of each channel, which are introduced by the process-temperature-voltage (PVT) variations in modern semiconductor process technology. The schematic of FIG. 1a includes two counters ($100_{UP}$ and $100_{DOWN}$) and a control logic unit 200. The counters each have a CLK input which is coupled to the incoming pulse train.

FIGS. 1b and 1c show the state diagrams of the UP and DOWN counters ($100_{UP}$ and $100_{DOWN}$), respectively. Each counter has N states ($V_1$ through $V_N$) in addition to an initial state (0) after a power-on-reset (POR) occurs. The state of the UP counter $100_{UP}$ changes when the CLK asserts from logic 0 to logic 1 (rising-edge) as shown in FIG. 1b. The state of the DOWN counter $100_{DOWN}$ changes when the CLK de-asserts from logic 1 to logic 0 (falling-edge) as shown in FIG. 1c. FIG. 1d shows that the DOWN counter can be realized by cascading an inverter and an UP counter.

Figure 2A:
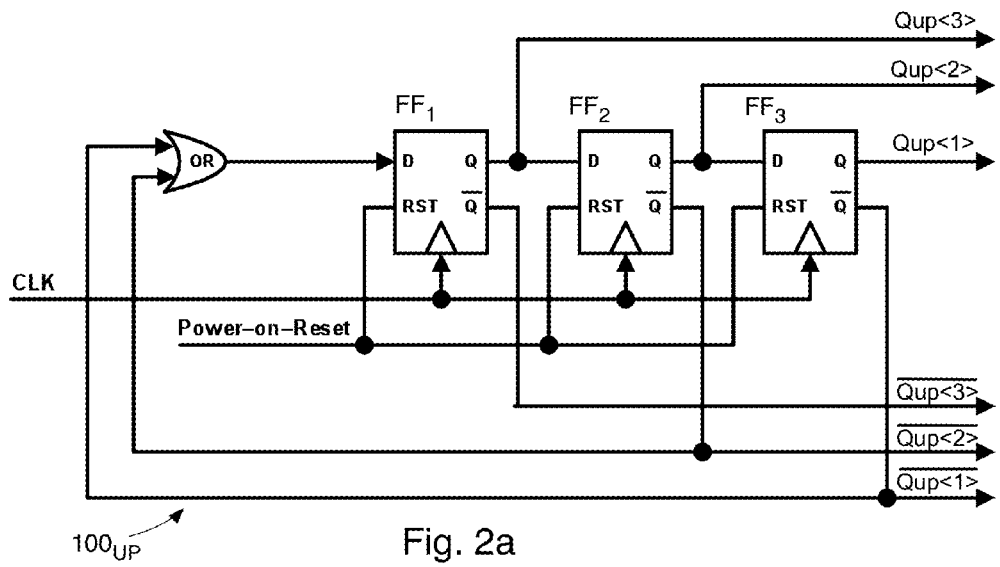
Figure 2B:
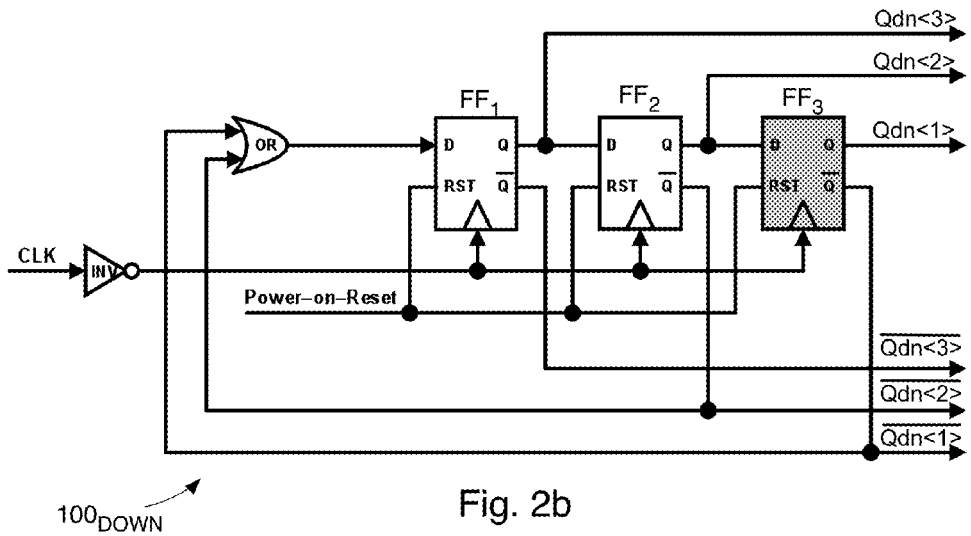
Figure 3A:
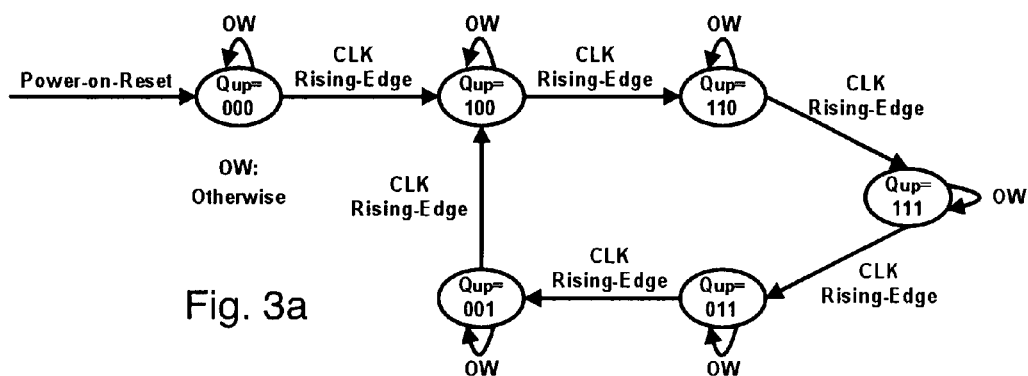
FIGS. 3a and 3b show the states through which the counters of FIGS. 2a and 2b respectively count.
Figure 3B:
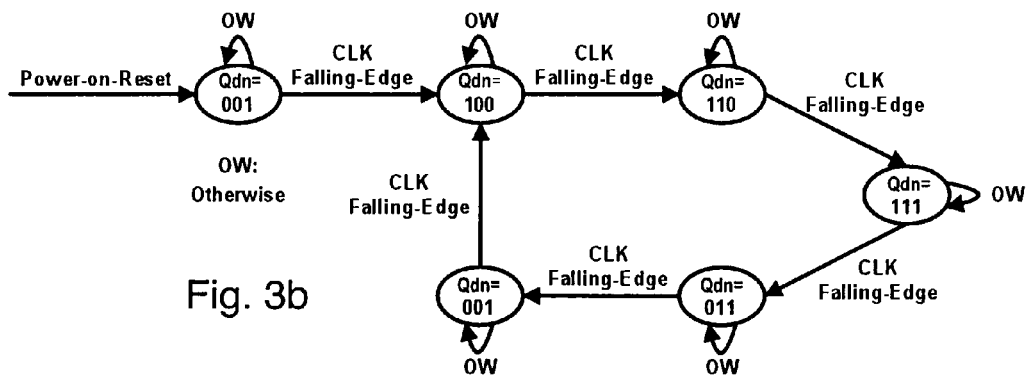

FIGS. 2a and 2b depict preferred embodiments of the UP and DOWN counters ($100_{UP}$ and $100_{DOWN}$), respectively for a 1-to-10 pulse de-multiplexer based on the architecture suggested herein. Each counter has three flip flops $FF_1$-$FF_3$ which, with the depicted OR gate in a feedback path, counts through five states as is generally shown by FIGS. 3a and 3b. The flip flops $FF_1$-$FF_3$ may be of a conventional clocked design. But it should be noted that they are not clocked by a clock signal CLK as are conventional flip flips, rather their CLK inputs are connected to the incoming pulse domain pulse train. The UP counter $100_{UP}$ changes state on rising (leading) edge transitions of the incoming pulse domain pulse train (signal CLK) as shown by FIG. 3a. The DOWN counter $100_{DOWN}$ goes through a similar sequence of states (shown in FIG. 3b), but the transitions occur on falling (trailing) edge transitions of the incoming pulse domain pulse train (from logic 1 to logic 0) instead of on the rising (leading) edges thereof. The two counters 100 are preferably identical to each other except for (i) the presence of an inverter INV in one of them (the inverter occurs at the front of the DOWN counter $100_{DOWN}$ in these embodiments) and (ii) the flop-flops reset to different values in order for them to follow the counting patterns shown in FIGS. 3a and 3b. Flip-flops $FF_1$-$FF_3$ of FIG. 2a all reset (on a Power on Reset) to a zero state, while flip-flop $FF_3$ of FIG. 2b resets (on a Power on Reset) to a one state and flip-flops $FF_1$ and $FF_2$ of FIG. 2b both reset (on a Power on Reset) to a zero state. $FF_3$ on FIG. 2b is drawn with a grey background in to help reflect this difference it how it resets compared to the other flip-flops of FIGS. 2a and 2b.

So each counter 100 automatically generates five (10 divided by 2) different values in this embodiment. After the power on reset, the output of the UP counter $100_{UP}$ (which has 5-states in this embodiment, excluding the power-on-reset state) becomes all zeros ($Q_{up}$=000) while the output of the DOWN counter $100_{DOWN}$ (which also has 5-states in this embodiment, excluding the power-on-reset state) becomes 001 ($Q_{down}$=001). Then when the signal CLK transitions from a logic 0 level to a logic 1 level (on the rising edge), the output of the UP counter $100_{UP}$ changes to $Q_{up}$=100. Every time when the signal CLK transitions from a logic 0 to logic 1 (on a rising or leading edge), the output $Q_{up}$ changes and follows the sequence as shown in FIG. 3a. The DOWN counter follows the same sequence, except it does it when the signal CLK transitions from a logic 1 level to a logic 0 level (on the trailing or falling edge) and thus the output of the DOWN counter is labeled $Q_{down}$. By applying the incoming asynchronous pulse train to the CLK inputs of the UP and DOWN counters $100_{UP}$ and $100_{DOWN}$ (instead of a traditional clock signal), the output values of UP and DOWN counters change at the rising and falling edges of the pulse train, respectively.

So, upon a Power on Reset the UP counter $100_{UP}$ assumes a value of "000" while the DOWN counter $100_{DOWN}$ assumes a value of "001". These values do not cause the gates $202_1$-$202_{10}$ of FIG. 4 (or the alternative gate arrangement embodiments of FIG. 8b) to assert (become true) as no data has yet be detected in incoming pulse domain pulse train (signal CLK). But when the first pulse is detected after a Power on Reset, the UP counter $100_{UP}$ changes from its reset value of "000" to "100" (as mentioned above) due to the action of the OR gate in FIG. 2a. While the first pulse is being detected (its falling edge has yet to be encountered), the DOWN counter $100_{DOWN}$ is still at its reset value of "001", and the gate arrangement $202_1$ asserts the signal Ych1 as true while the other gate arrangements $202_2$-$202_{10}$ remain at a false state. If the DOWN counter $100_{DOWN}$ had reset to a "000" (like the UP counter $100_{UP}$ does) then value the signal Ych1 would not be correctly asserted on the leading edge of the first pulse after a reset. On detection of the falling edge, the DOWN counter $100_{DOWN}$ changes from its reset value of "001" to "100" due to the action of the OR gate in FIG. 2b. The logic feedback implemented by the OR gates in FIGS. 2a and 2b conveniently cause the first state to be encountered by the counters to be a "100" state whether their reset value is a "000" or a "001".

Figures 3C, 3D:
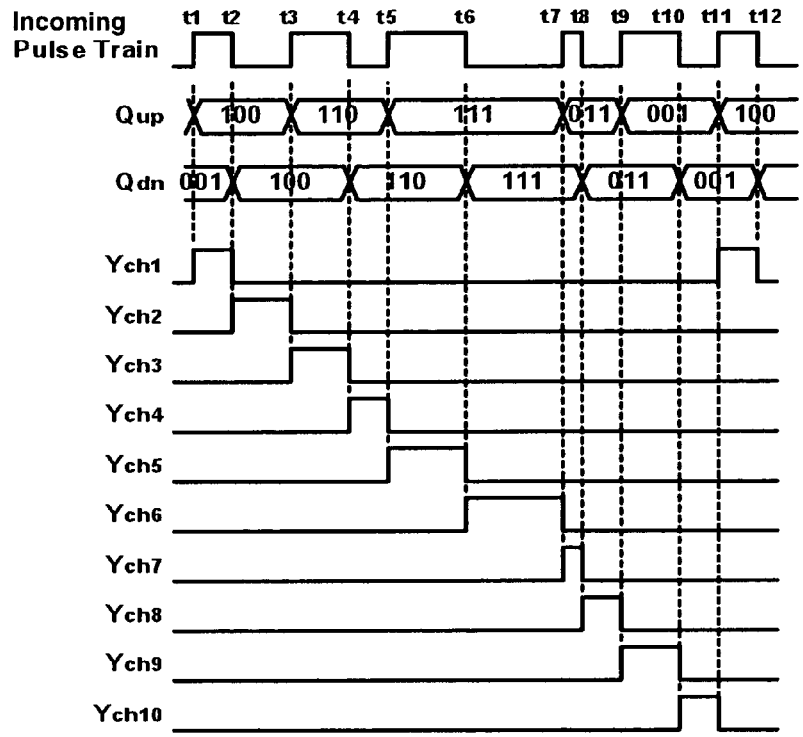
FIG. 3c depicts an exemplary incoming asynchronous pulse train with the count states of the counters of FIGS. 2a and 2b associated therewith, while FIG. 3d conveys this information in a tabular format.

The number of states through which each counter counts is equal to one-half the number of channels in the de-multiplexer. So if the de-multiplexer has 2N channels CH1 (which carries signal $Y_{ch1}$) through CH2N (which carries signal $Y_{ch2N}$), then the number of states through which each of the two counters $100_{UP}$ and $100_{DOWN}$ count is then N. In this particular embodiment N is set equal to five and thus the de-multiplexer is a 1 to 10 demultiplexer with ten output channels CH1-CH10 carrying signals $Y_{ch1}$-$Y_{ch10}$. The relationship between the five states of each counter 100 (and their output values $Q_{up}$ and $Q_{down}$) and the data output by the ten channels of the demultiplexer is depicted by FIG. 3c and also by the table of FIG. 3d. Since each counter 100 preferably counts through the same sequence, a limited number of the combinations for both counter output values $Q_{up}$ and $Q_{down}$ occur. These combinations of values of $Q_{up}$ and $Q_{down}$ are detected by control logic 200 that in combination with the counters 100 demultiplexes the incoming pulse widths onto the ten output channels CH1-CH10 with respective signals $Y_{ch1}$-$Y_{ch10}$. Generally speaking, for other embodiments (for example, when N has a different value) then the number of flip flops in each counter (arranged with appropriate feedback logic) equals either (i) $\log_2$ (N) when N is equal to a power of the number 2 or (ii) equals $\lceil \log_2$ (N)+1$\rceil$ when N is otherwise. The ceiling function ($\lceil$ $\rceil$) signifies that the calculated value is rounded up to the next whole integer/number.

Figure 4:
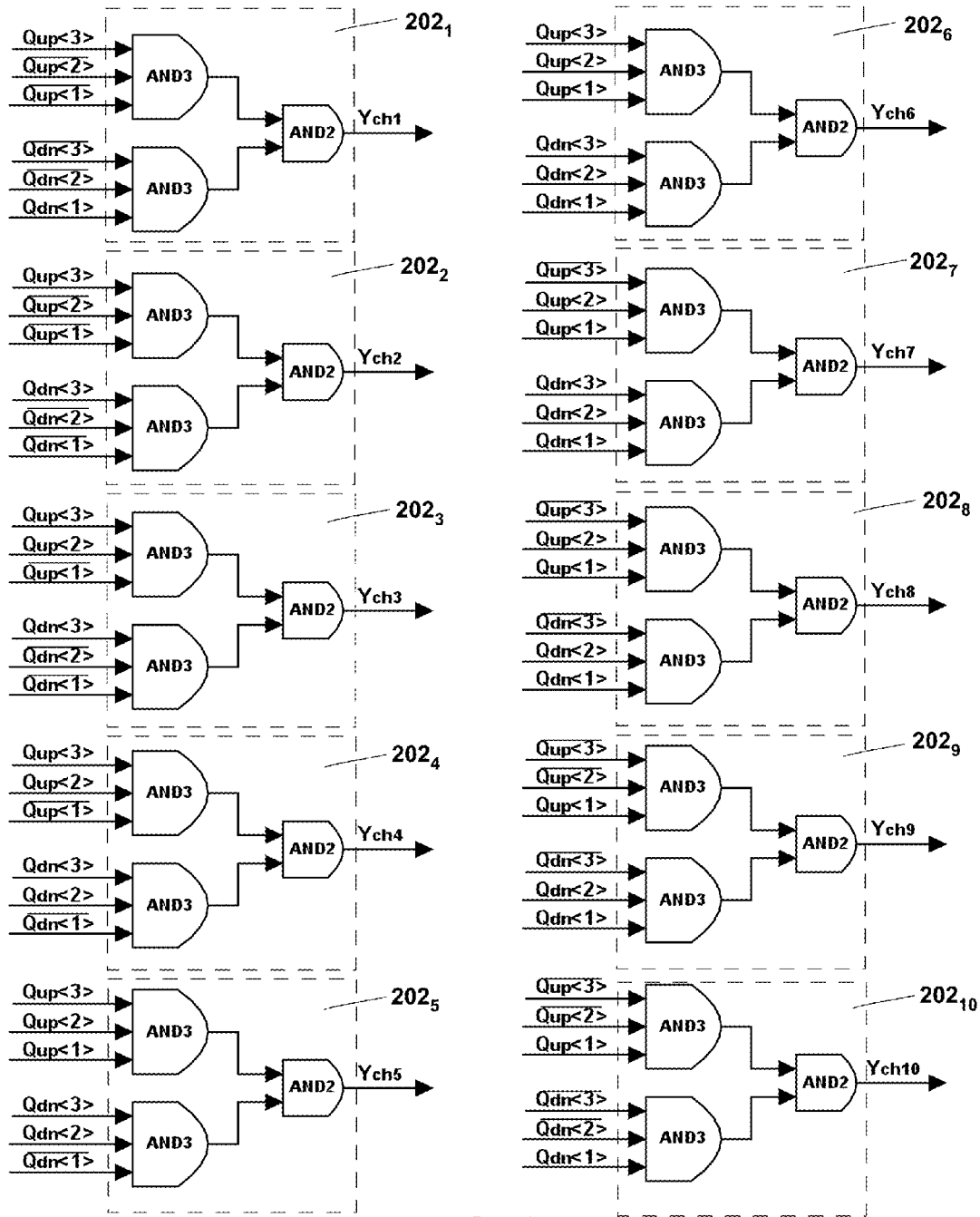
FIG. 4 is a schematic diagram of one embodiment of the control logic 200 of FIG. 1.
Figure 7:
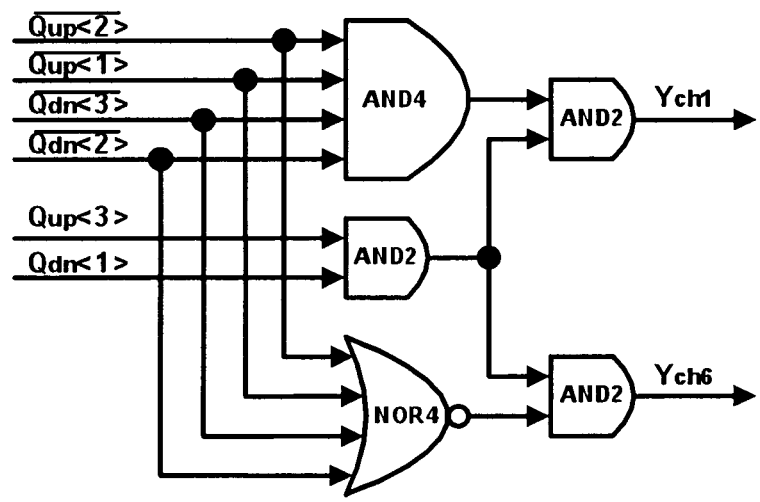
FIG. 7 depicts an alternative way of generating two exemplary output channel signals ($Y_{ch1}$ and $Y_{ch6}$) where the critical paths for those two output signals are time-wise different, thereby yielding a less desirable way of generating output channel signals.

As shown in FIGS. 3a and 3b, when the outputs values $Q_{up}$ of the UP counter $100_{UP}$ and the outputs values $Q_{down}$ of the DOWN counter $100_{DOWN}$ are "100" and "001", respectively, the pulse width (from rising to falling edges) for channel 1 ($Y_{ch1}$) will be generated. The sample principle applies on the pulse-widths of CH2 to CH10. A logic minimization approach based on the truth table (see FIG. 3c) to implement the pulse-width extraction for each channel may lead to large variations on the path-delays of each channel. For example, $Y_{ch1}$ and $Y_{ch6}$ can be implemented by the schematic shown in FIG. 7, where the critical paths for $Y_{ch1}$ and $Y_{ch6}$ are (AND4+AND2) and (NOR4+AND2), respectively, are different. Therefore, the path-delays of $Y_{ch1}$ and $Y_{ch6}$ are different in that embodiment. Also, due to the different complexities of the gate (essentially the numbers of transistors), race conditions can occur since the time needed for their gates to react to their inputs may be different resulting in hiccups in the data being outputted. In order to overcome these disadvantages, the pulse-width extraction logic for each channel in CTRL Logic 200 is preferably implemented with the same number of asynchronously logic stages and the same number of asynchronously logic gates per channel as shown in FIG. 4 to minimize the path-delay difference within each channel. In this connection it should be noted that there are ten gate arrangements $202_1$ through $201_{10}$ each one of which is identical (except for the polarities of the bits from the counters 100) with gate arrangement $202_1$ generating channel CH1 ($Y_{ch1}$), gate arrangement 2022 generating channel CH2 ($Y_{ch2}$), gate arrangement 2023 generating channel CH3 ($Y_{ch3}$), and so forth. Each gate arrangement 202 is of the same complexity so any delay in generating the outputs signals $Y_{ch1}$ through $Y_{ch10}$ will be independent of the channel. Additionally within each gate arrangement 202, the output gate (AND2) has two identical gates (AND3) connected to its inputs and therefor the propagation times through these gates in arrangements 202 should not be subject a race condition where the propagation time for the inputed signal form the counter is bitwise different. So this arrangement 202 minimizes that likelihood of a race condition arising at their outputs.

Figure 8A:
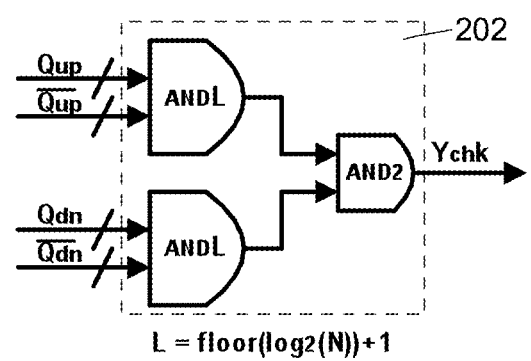
FIG. 8a shows a generic schematic for the gate arrangement 202 in each channel of the CTRL Logic block 200.
Figure 8B:
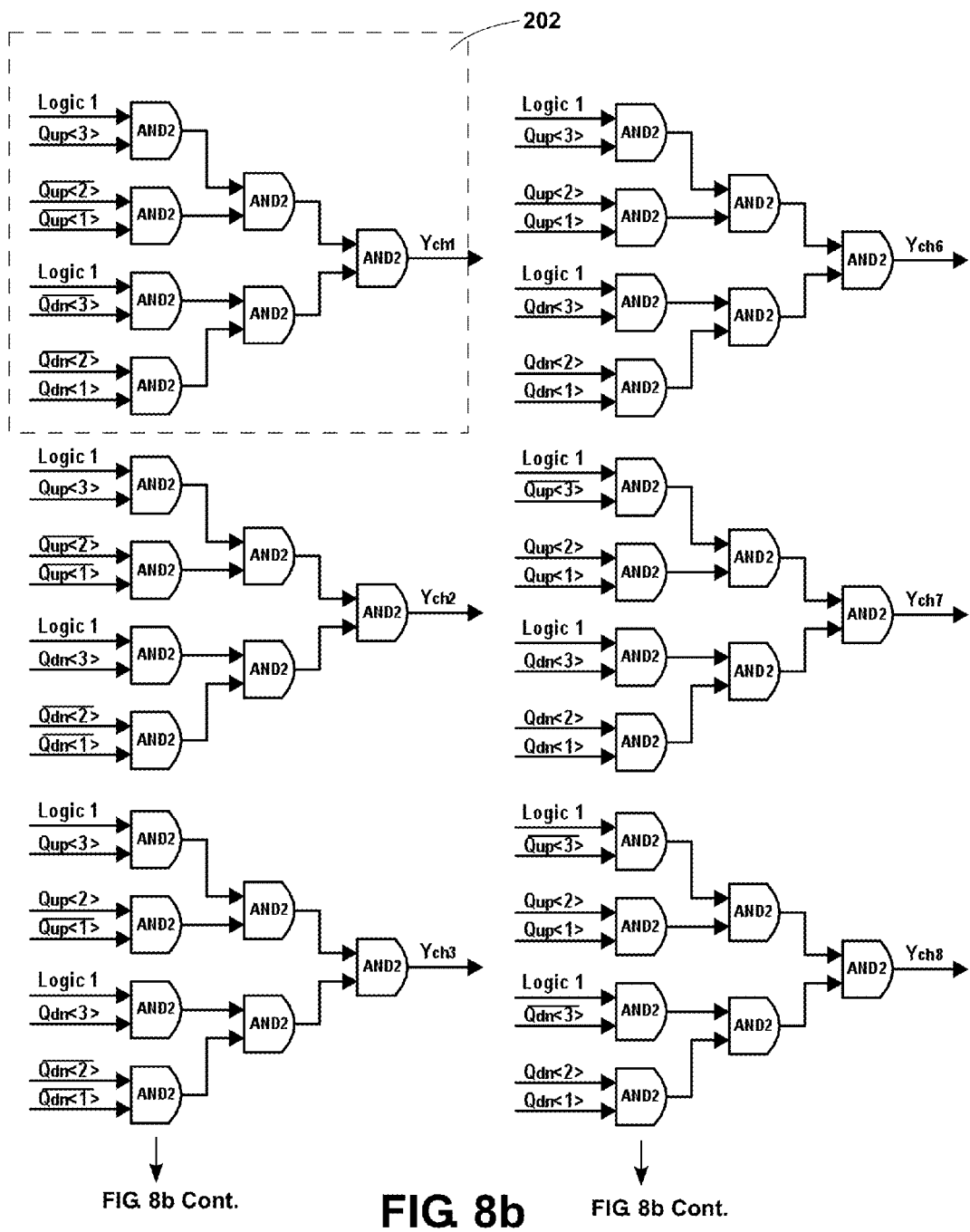
FIG. 8b shows an alternative schematic to the one shown in FIG. 4 for the CTRL Logic block 200.
Figure 8B:
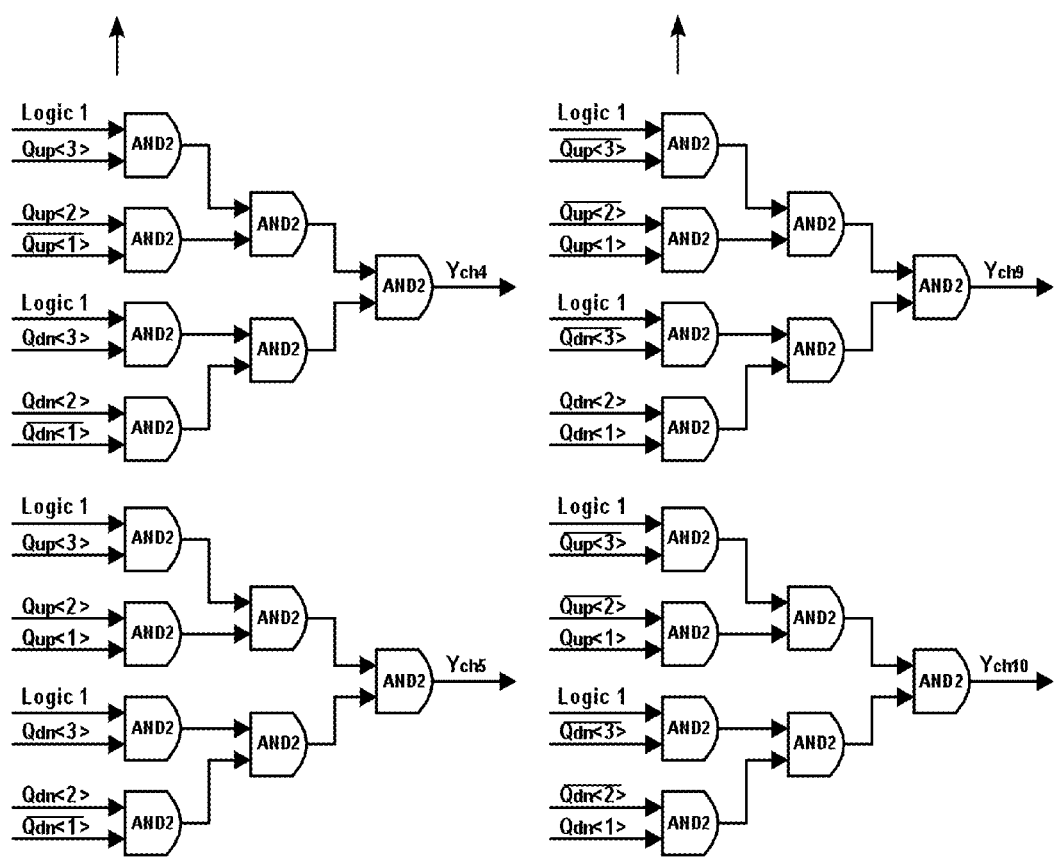

FIG. 8a shows a generic schematic for the gate arrangement 202 of each channel of the CTRL Logic block 200 in FIG. 1a. The schematic consists of two-level gate logics. The $1^{st}$ level are two L-input AND gates (AND gates with a number "L" inputs), each of which takes the outputs of the UP and DOWN counters $100_{UP}$ and $100_{DOWN}$, respectively. The $2^{nd}$ level is a 2-input AND gate, which takes the outputs of the aforementioned two L-input AND gates. However, as the number of de-multiplexed channels (2N) increases, there may be a fan-in issue on the L-input AND gate since L is proportional to N as indicated in FIG. 8a. That issue can be resolved by replacing the L-input AND with a cascade of multiple small-number-input AND gates (e.g. 2-input AND gates). For example, FIG. 8b shows an alternative schematic to the one shown in FIG. 4 where each 3-input AND is replaced by three 2-input ANDs.

A static offset of pulse-width in each channel can exist due to the process-temperature-voltage (PVT) variations in semiconductor process technology. To help compensate for this static offset, FIGS. 5a-5d and 6 propose an approach to estimate this static measurement offset for each channel. Using CH1 as an example, when a constant (DC) input ($d_k$) is applied on the voltage-to-time converter (TEM in FIG. 6), a periodic pulse train will be generated, and the pulse width of positive and negative half-period ($\Delta t_1$ and $\Delta t_2$) can be derived analytically. Therefore, the static offset for a constant input ($d_k$) is calculated as $(\Delta_1)_{d_k}=(\Delta t_{CH1})_{d_k}-(\Delta t_1)_{d_k}$ where $(\Delta t_{CH1})_{d_k}$ is the measurement value. By repeating the same procedure with various values of constant input ($d_k$), the static measurement offset for CH1 is estimated as $$\Delta_1 = \frac{1}{M}\sum_{k=1}^{M}(\Delta_1)_{d_k}.$$

The approach applies on CH2 to CH10. The static offsets ($\Delta_1, \Delta_2, \Delta_3, \ldots$) of pulse-width measurements for each channel are generated as a result of PVT. The approach proposed in FIGS. 6a, 6b and 7 (and summarized in FIG. 9) is for estimating those offsets so the pulse-width measurement ($\Delta t_{CH1}, \Delta t_{CH2}, \Delta t_{CH3}, \ldots$) for each channel can be calibrated by subtracting those estimated offsets as needed.

Figure 5A:
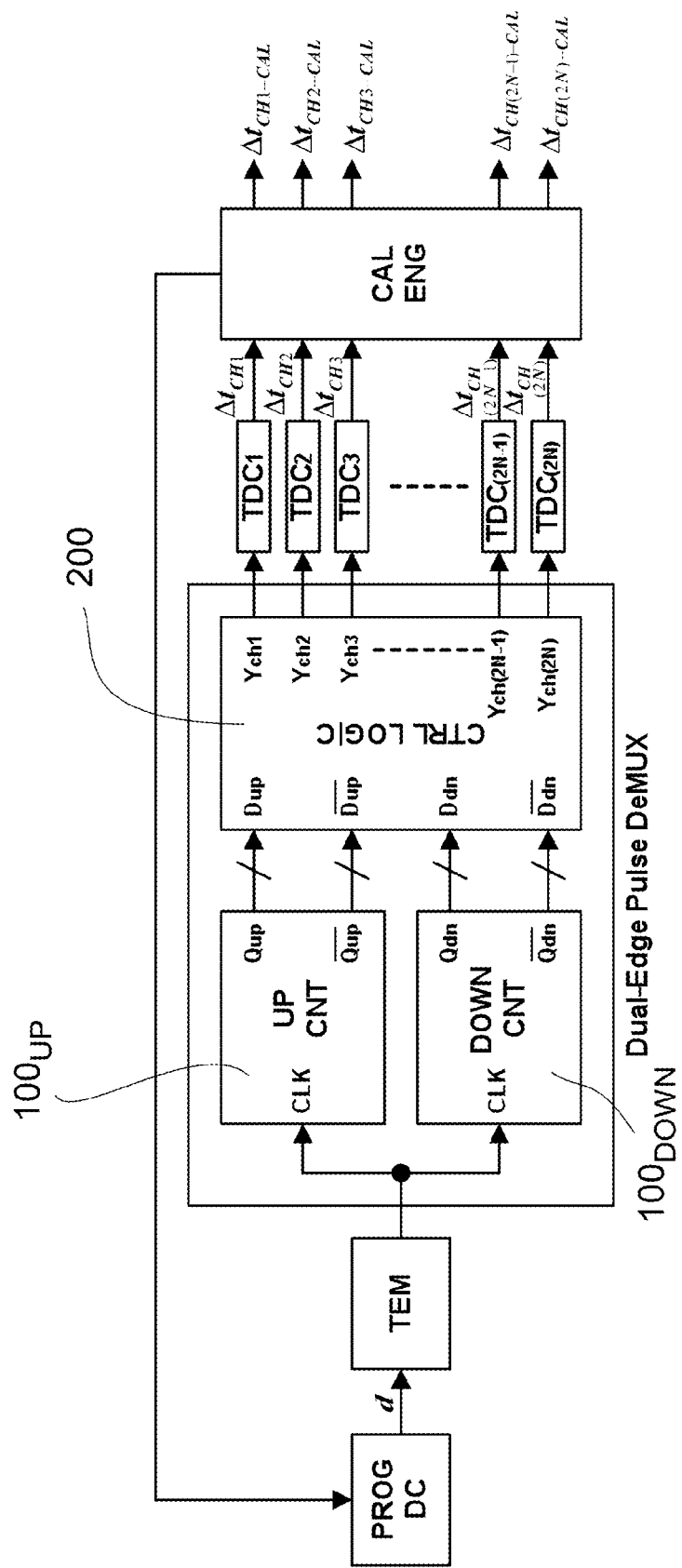
Figure 5C:
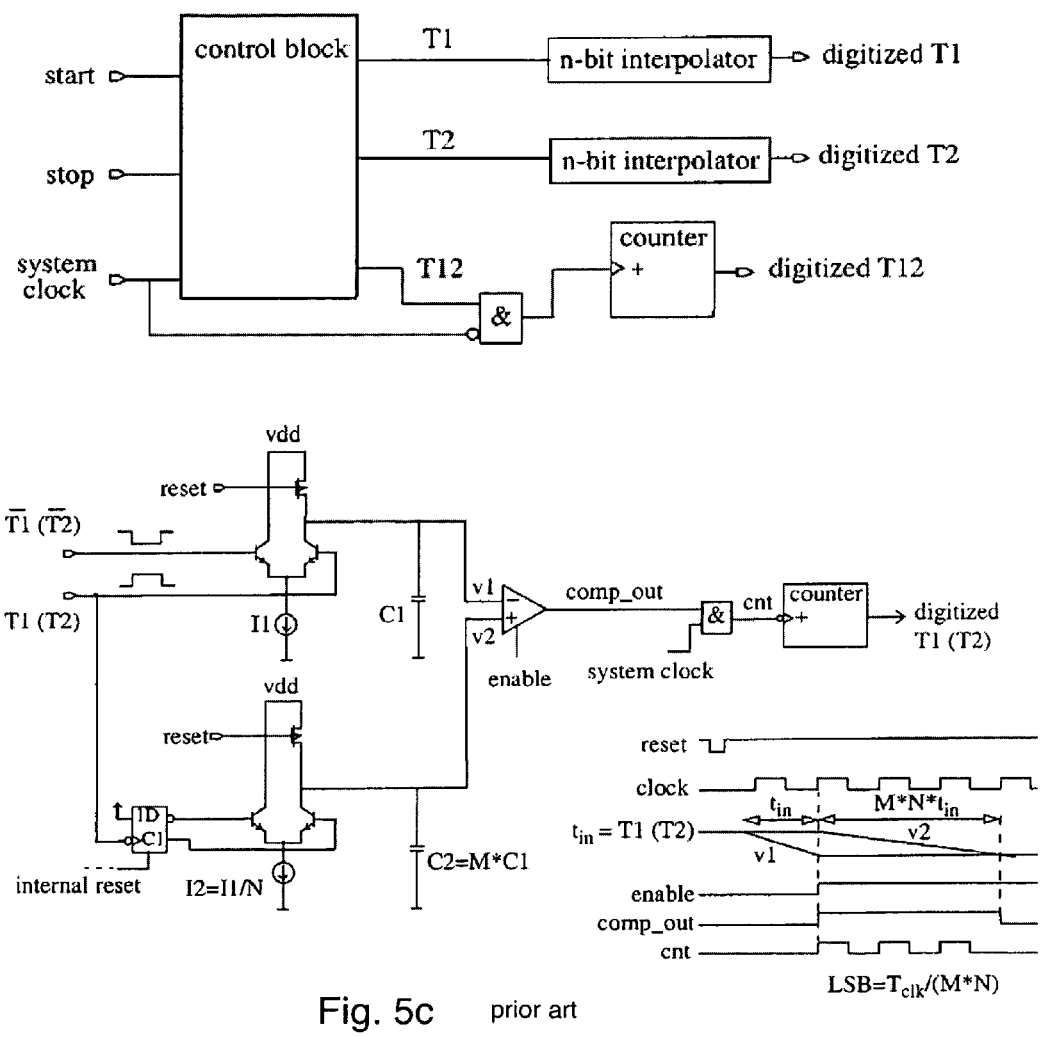
FIGS. 5c and 5d show exemplary implementations for the TDC and TEM, respectively.
Figure 5D:
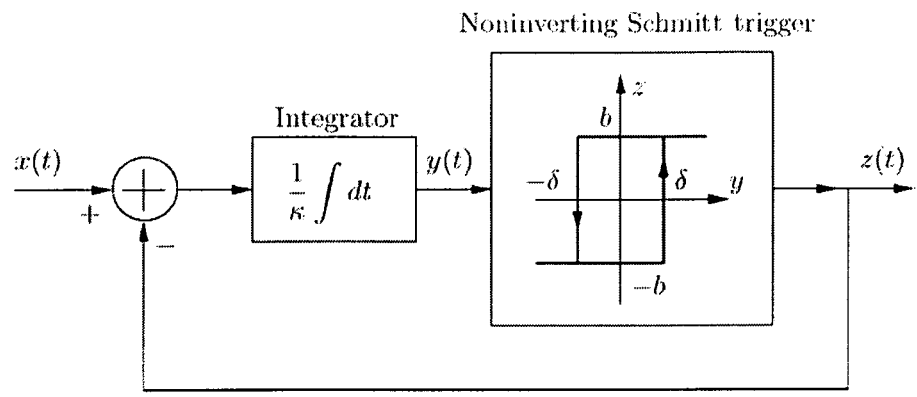

FIGS. 5a, 5b and 6 illustrate the s calibration algorithm and a circuit for calibration measurements. As shown in FIG. 5a, the calibration procedure utilizes, a programmable DC source (PROG DC), a voltage-to-time (V2T) converter such as time-encoder machine (TEM) or pulse-width modulator (PWM), as well as a bank of time-to-digital converters (TDCs), each of which can measure the pulse-widths of the corresponding channel output of the CTR Logic 200 of FIG. 1a. FIG. 5c (from Raisanen-Ruotsalainen, Elvi; Rahkonen, T.; Kostamovaara, J., "An integrated time-to-digital converter with 30-ps single-shot precision," Solid-State Circuits, *IEEE Journal of Solid-State Circuits*, vol. 35, no. 10, pp. 1507, 1510, October 2000) and FIG. 5d (from Lazar, A. A.; Toth, L. T., "Perfect recovery and sensitivity analysis of time encoded bandlimited signals," *IEEE Transactions on Circuits and Systems I: Regular Paper*, vol. 51, no. 10, pp. 2060, 2073, October 2004) show the exemplary implementations for the TDC and TEM, respectively.

One of the most important features of such V2T (e.g. TEM) is that it can generate a periodic pulse train when a constant voltage (DC) is applied on its input. Furthermore, the value of this constant voltage input controls the duty cycle (the positive and negative pulse widths) of the periodic pulse train output. Given a known value of the DC input (d), the positive and negative pulse widths ($\Delta t_1$ and $\Delta t_2$) can be derived analytically. When applying the generated periodic pulse train to the 1-to-10 dual-edge pulse de-multiplexer, positive and negative pulse widths of the periodic input will appear at the odd channels (CH1, CH3, CH5, CH7 and CH9), and even channels (CH2, CH4, CH6, CH8 and CH10), respectively.

As shown in FIG. 5b, for the odd channels, their measurement values—$\Delta t_{CH1}$, $\Delta t_{CH3}$, $\Delta t_{CH5}$, $\Delta t_{CH7}$, $\Delta t_{CH9}$—should be the same and equal to $\Delta t_1$ if there is no PVT variation. However, the constant offsets—$\Delta_1$, $\Delta_3$, $\Delta_5$, $\Delta_7$, $\Delta_9$—are incorporated into the measurement values of each odd channel, respectively when the PVT variations are involved. It makes the measurement values—$\Delta t_{CH1}$, $\Delta t_{CH3}$, $\Delta t_{CH5}$, $\Delta t_{CH7}$, $\Delta t_{CH9}$—not equal anymore. The calibration procedure computes the average of the measurement values—$(\Delta t_{CH1})_{d_k}$, $(\Delta t_{CH3})_{d_k}$, $(\Delta t_{CH5})_{d_k}$, $(\Delta t_{CH7})_{d_k}$, $(\Delta t_{CH7})_{d_k}$, $(\Delta t_{CH9})_{d_k}$—under the condition of applying $d_k$ as the DC input, and denotes this average value as $(\Delta t_1)_{d_k}$. The calibration procedure further estimates the constant offset—$(\Delta_1)_{d_k}$, $(\Delta_3)_{d_k}$, $(\Delta_5)_{d_k}$, $(\Delta_7)_{d_k}$, $(\Delta_9)_{d_k}$—for each odd channel under the same DC input ($d_k$) condition by using this average value $(\Delta t_1)_{d_k}$. Using CH1 as an example, the $(\Delta_1)_{d_k}$ is computed as $(\Delta t_{CH1})_{d_k} - (\Delta t_1)_{d_k}$. The same operation applies on other odd channels (CH3 to CH9). The above procedure is repeated with respect to various DC input ($d_k$) values. Finally the estimated constant offset for each odd channel is computed as the average value of the estimated constant offsets with respect to each DC input ($d_k$). Using CH1 as an example, the estimated constant offset, $\Delta_1$, is computed as $$\frac{1}{M}\sum_{k=1}^{M}(\Delta_1)_{d_k}.$$

The same computation applies on other odd channels (CH3 to CH9). The estimated constant offsets—$\Delta_1$, $\Delta_3$, $\Delta_5$, $\Delta_7$, $\Delta_9$—will be used to calibrate the measurement values. Using CH1 as an example, the calibrated measurement value, $\Delta t_{CH1-CAL}$, is computed as $\Delta t_{CH1} - \Delta_1$. The same computation applies on other odd channels (CH3 to CH9).

For the even channels (CH2, CH4, CH6, CH8, and CH10), their calibrated measurement values are obtained through the same approach described above. The calibration procedure for the even channels can be executed concurrently (in parallel) with the one for odd channels.

Figure 9:
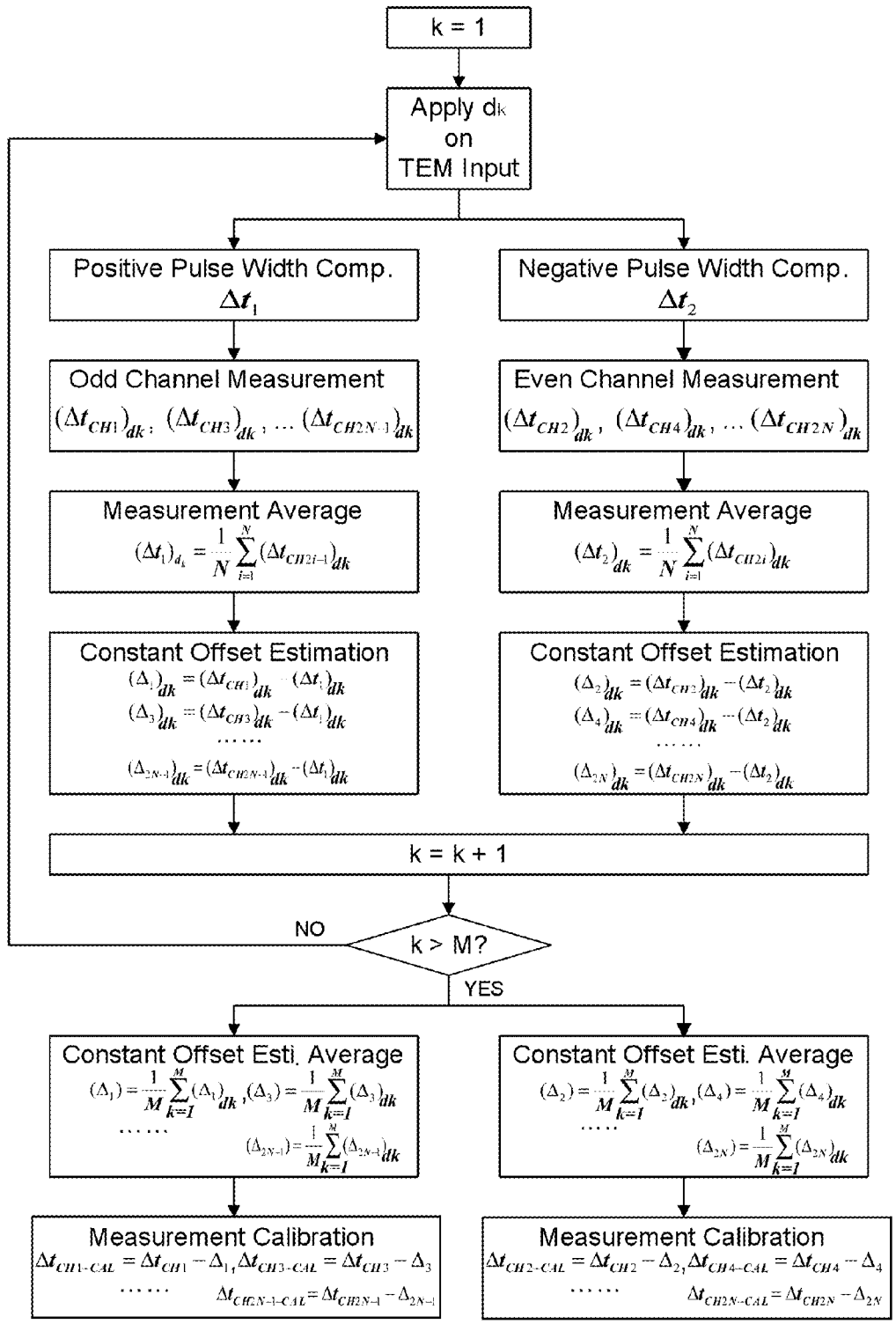
FIG. 9 depicts the flow chart of the calibration procedure.

FIG. 9 depicts the flow chart of the suggested calibration procedure and summarizes the materials presented in the preceding five paragraphs. In FIG. 9, the control flow and the blocks of positive/negative pulse width computation, measurement average, constant offset estimation, constant offset estimation average, and measurement calibration are executed in the calibration engine (CAL ENG), which is shown in FIG. 5a, and can be implemented through a micro-controller/processor.

The use of this calibration procedure is optional in that the PVT variations may not be so significant in some applications to require that they be compensated for. PVT variations are undesirable and therefor occur unintentionally, but they can occur as an intrinsic artifact of modern semiconductor manufacturing technologies.

Testing results show that the asynchronous de-multiplexer disclosed herein can de-multiplex the pulse train with at least 2 GHz average pulse rates, counting both positive and negative pulses, so it is capable of high speed operation.

This concludes the description of embodiments of the present invention. The foregoing description of these embodiments and the methods of making same has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description, but rather by the claims appended hereto.

What is claimed is:

1. A pulse domain 1 to 2N demultiplexer comprising:
   i. a pair of N stage counters each of which is responsive to an incoming pulse train in the pulse domain, one of said counters being responsive to leading edges of the pulses in said incoming pulse train and the other one of said counters being responsive to trailing edges of the pulses in said incoming pulse train;
   ii. control logic responsive to the states through which said pair of counters count, the control logic including 2N gate arrangements, each of the 2N gate arrangements generating a output signal of said pulse domain 1 to 2N demultiplexer.

2. The pulse domain 1 to 2N demultiplexer of claim 1 wherein each of the N stage counters has two multi-bit outputs, one of which is in true logic (Q) and the other of which is in inverted logic ($\overline{Q}$), different bits of the true logic (Q) and inverted logic ($\overline{Q}$) being applied to each of the 2N gate arrangements so that each gate arrangement is responsive to one of the N possible counts of each of said N stage counters.

3. The pulse domain 1 to 2N demultiplexer of claim 2 wherein N=5 so the demultiplexer is a 1 to 10 demultiplexer and wherein the N stage counter responsive to leading edges of pulses in said incoming pulse train comprises three flip-flops with an up counter feedback circuit whereby the N stage counter responsive to leading edges in said incoming pulse train is arranged to count a through sequence of 100, 110, 111, 011, 001 in response to leading edges of pulses in said incoming pulse train and wherein the N stage counter responsive to trailing edges of pulses in said incoming pulse train comprises three flip-flops with a down counter feedback circuit whereby the N stage counter responsive to trailing edges in said incoming pulse train is arranged to count through a sequence of 100, 110, 111, 011, 001 in response to trailing edges of pulses in said incoming pulse train.

4. The pulse domain 1 to 2N demultiplexer of claim 2 wherein each of the 2N gate arrangements has an identical complexity in terms for the number and types of gates used to implement each of the 2N gate arrangements.

5. The pulse domain 1 to 2N demultiplexer of claim 1 in combination with a calibration algorithm for estimating a pulse width measurement offset to counteract process-temperature-voltage (PVT) variations occurring in semiconductor process technology.

6. The pulse domain 1 to 2N demultiplexer of claim 1 wherein said pair of counters are asynchronous counters each comprising a number of flip flops arranged with feedback logic, where the number of flip-flop equals either (i) $\log_2(N)$ when N is equal to a power of 2 or (ii) equals $\lceil \log_2(N)+1 \rceil$ when N is otherwise.

7. The pulse domain 1 to 2N demultiplexer of claim 1 wherein said pair of counters are asynchronous counters each comprising three flip flops and wherein five of the flip flops in said two counters reset to a first state in response to a power up reset signal and wherein one of the flip flops in said two counters resets to a different state than said first state in response to said power up reset signal.

8. A method of demultiplexing a pulse domain signal with pulses having leading and trailing edges, a time interval between leading and trailing edges and/or between trailing and leading edges of pulses in said conveying information to be demultiplexed, said method comprising;
   a. detecting leading edges of the pulses in said pulse domain signal in a first circuit, the first circuit counting through a fixed number of different states in a fixed pattern in response to said leading edges of the pulses in said pulse domain signal;
   b. detecting trailing edges of the pulses in said pulse domain signal in a second circuit, the second circuit counting states in the same fixed number of different states in the same fixed pattern as the first circuit in response to said trailing edges of the pulses in said pulse domain signal;
   c. comparing the states of the first and second circuits and generating a number (2N) of different pulse domain output signals based on this comparing step, the different pulse domain output signals each corresponding to a demultiplexed version of said pulse domain signal.

9. The method of claim 8, wherein the number (2N) of different pulse domain output signals is equal to twice said fixed number.

10. The method of claim 8 wherein said comparing step is performed by 2N gate arrangements, each said gate arrangement being of equal complexity to each other gate arrangement so that each of the 2N of different pulse domain output signals is generated with a common amount of intentional time delay relative to said pulse domain signal.

11. The method of claim 10 in combination with a calibration algorithm for estimating a pulse width measurement offset for each of said 2N of different pulse domain output signals to counteract process-temperature-voltage (PVT) variations occurring in semiconductor process technology.

12. A circuit for demultiplexing a pulse domain signal, the pulse domain signals having pulses with leading and trailing edges, a time interval between leading and trailing edges and/or between trailing and leading edges of pulses in said conveying information to be demultiplexed, said method comprising;
   a. a first circuit for detecting leading edges of the pulses in said pulse domain signal, the first circuit counting through a fixed number of different states in a fixed pattern in response to said leading edges of the pulses in said pulse domain signal;
   b. a second circuit for detecting trailing edges of the pulses in said pulse domain signal, the second circuit counting states in the same fixed number of different states in the same fixed pattern as the first circuit in response to said trailing edges of the pulses in said pulse domain signal;
   c. logic means for comparing the states of the first and second circuits and generating a number (2N) of different pulse domain output signals based on this comparing step, the different pulse domain output signals each corresponding to a different demultiplexed version of said pulse domain signal.

13. The circuit of claim 12 wherein each of said first and second circuits comprises a number of flip flops connected in series with a feedback circuit so that the flip flops in said first and second circuits count through a predetermined sequence of states respectively in response to the leading and trailing edges of the pulses in said pulse domain signal.

14. The circuit of claim 13 wherein the logic means comprises 2N gate arrangements, each gate arrangement being responsive to a current state of each of said flip flops in said first and second circuits.

15. The circuit of claim 14 each said 2N gate arrangement are of equal complexity to each other so that each of the 2N of different pulse domain output signals is generated with a common amount of intentional time delay relative to the pulse domain signal being demultiplexed.

* * * * *